(12) United States Patent
Jwo

(10) Patent No.: US 6,515,321 B1
(45) Date of Patent: Feb. 4, 2003

(54) STRUCTURE OF A COMPLEMENTARY METAL OXIDE SEMICONDUCTOR SENSOR

(75) Inventor: Mao-Shin Jwo, Chang-Hua Hsien (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/474,737

(22) Filed: Dec. 29, 1999

Related U.S. Application Data

(63) Continuation-in-part of application No. 09/210,276, filed on Dec. 10, 1998, now abandoned.

(30) Foreign Application Priority Data

Aug. 24, 1998 (TW) ........................................ 87113893 A

(51) Int. Cl.$^7$ ........................ H01L 31/062; H01L 31/06
(52) U.S. Cl. ........................................ 257/292; 257/462
(58) Field of Search ................................ 257/335, 336, 257/344, 408, 232, 233, 234, 291, 292, 440, 464, 465, 461, 462; 438/228

(56) References Cited

U.S. PATENT DOCUMENTS

| | | | | |
|---|---|---|---|---|
| 5,932,906 A | * | 8/1999 | Shimizu | ..................... 257/306 |
| 6,074,904 A | * | 6/2000 | Spikes, Jr. et al. | .......... 438/223 |
| 6,104,063 A | * | 8/2000 | Fulford, Jr. et al. | ........ 257/344 |
| 6,165,827 A | * | 12/2000 | Ahmad et al. | .............. 438/231 |
| 6,255,681 B1 | * | 7/2001 | Pan | ............................. 257/292 |

FOREIGN PATENT DOCUMENTS

JP  5-315561  * 11/1993

* cited by examiner

Primary Examiner—Tom Thomas
Assistant Examiner—Hung Kim Vu

(57) ABSTRACT

A metal-oxide semiconductor sensor. A metal-oxide semiconductor is formed in an active region defined by an isolation. A sensor implantation region is formed adjacent to a side of only one source/drain region of the metal-oxide semiconductor. A depletion region is thus induced around the sensor implantation region with a distance away from the isolation. Therefore, the white spots on the screen can be eliminated.

12 Claims, 3 Drawing Sheets

STRUCTURE OF A COMPLEMENTARY METAL OXIDE SEMICONDUCTOR SENSOR

This is a Continuation-in-part application of copending prior application Ser. No. 09/210,276 filed Dec. 10, 1998 abandoned.

BACKGROUND OF THE INVENTION

1. Field of Invention

The present invention relates to a semiconductor manufacturing method and a structure. More particularly, the present invention relates to a metal oxide semiconductor sensor that solves that problem of white spot.

2. Description of Related Art

FIG. 1 is a cross-sectional view of a sensor of a conventional complementary metal oxide semiconductor (CMOS) sensor.

In FIG. 1, the P-type well 101 is located on an N-type substrate 100. A first oxide layer 102 and a second oxide layer 103 are located in on the P-type well 101. The first oxide layer 102 and the second oxide layer 103 define an active region 104. A gate oxide layer 105 is located on the active region 104. A gate conductive layer 106 is located on the gate oxide layer 105. The first spacer 107 and the second spacer 108 are located on the side walls of the gate conductive layer 106. The first lightly doped drain region 109 and the second lightly doped drain region 110 are located below the first spacer 107 and the second spacer 108 in the P-type substrate 101. A first source/drain region 112 is located between the first lightly doped drain region 109 and the first field oxide layer 102 in the P-type substrate 101. A second source/drain region 113 is functioned as a sensor implantation region. Thus constructed, a depletion region is formed along the profile of the second source/drain region, that is, the implantation region 113, at a junction between the implantation region 113 and the P-well 101. The induced depletion region is the region between the solid line that outlines the second source/drain region 113 and the dash line illustrated in FIG. 1.

While operating the conventional CMOS sensor, white spots are often observed on the screen. The white spots occur because of current flowing through the junction between the depletion region and the field oxide layer. The defects caused by the stress applied during forming the field oxide layer, or due to the Koii effect are the main reason that induce the current.

SUMMARY OF THE INVENTION

The present invention provides a fabricating method and a structure of complementary metal oxide semiconductor sensor. In the CMOS sensor, a depletion region is designed away from an field oxide layer. Therefore, the current can not flow along the junction between the depletion region and field oxide layer. And thus, even defects are formed around the field oxide layer, the white spot phenomenon is eliminated.

The invention provides a structure of CMOS sensor. The sensor includes at least a first conductive type well, an isolation on the well, a metal-oxide semiconductor in the well, and a sensor implantation region adjacent to or even overlapping with one side of only one source/drain region of the metal-oxide semiconductor. In addition, the sensor implantation region is distant away from the isolation. That is, between the isolation and the sensor implantation region, there is a portion of well region without being further doped.

With this design, the depletion region induced around the sensor implantation region is not adjacent to the isolation, or is even distant away from the isolation, so that there is no worry that the current may flows to the isolation. Therefore, the white spots can be eliminated from the screen.

The invention provides a fabricating method of CMOS sensor. A substrate having a well, a first and a second isolations on the P-well, and a gate on the P-well between the first and the second isolations is provided. Using a mask to cover a portion of the well between the second isolation and the gate and the second isolation, a first and a second source/drain regions are formed. Therefore, the second source/drain region is formed with a distance away from the second isolation. The first mask is removed. Using a second mask to cover the first and second isolations, the first and second source/drain regions, and a portion of the P-well adjacent to the second isolation, a sensor implantation region is formed. Since the portion of the P-well adjacent to the second isolation is covered by the second mask, the sensor implantation region is not in contact with the second isolation.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
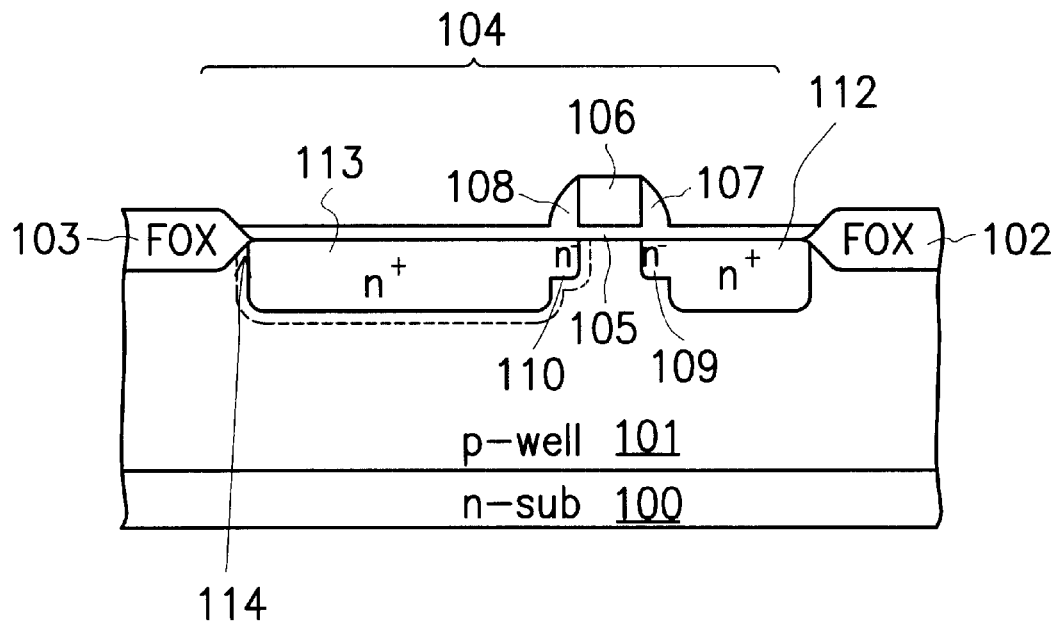
FIG. 1 is a cross-sectional view of a portion of a semiconductor device showing a conventional complementary metal oxide semiconductor (CMOS) sensor.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
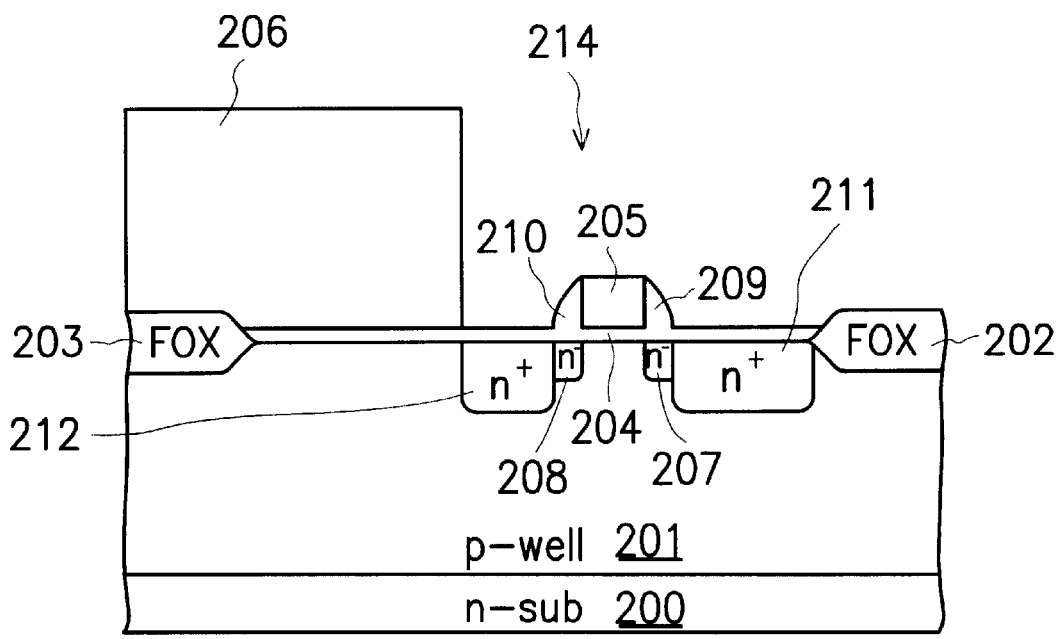
FIGS. 2A through 2C are cross-sectional views of a portion of a semiconductor device showing a complementary metal oxide semiconductor sensor according to one preferred embodiment of the invention.
Figure 2B:
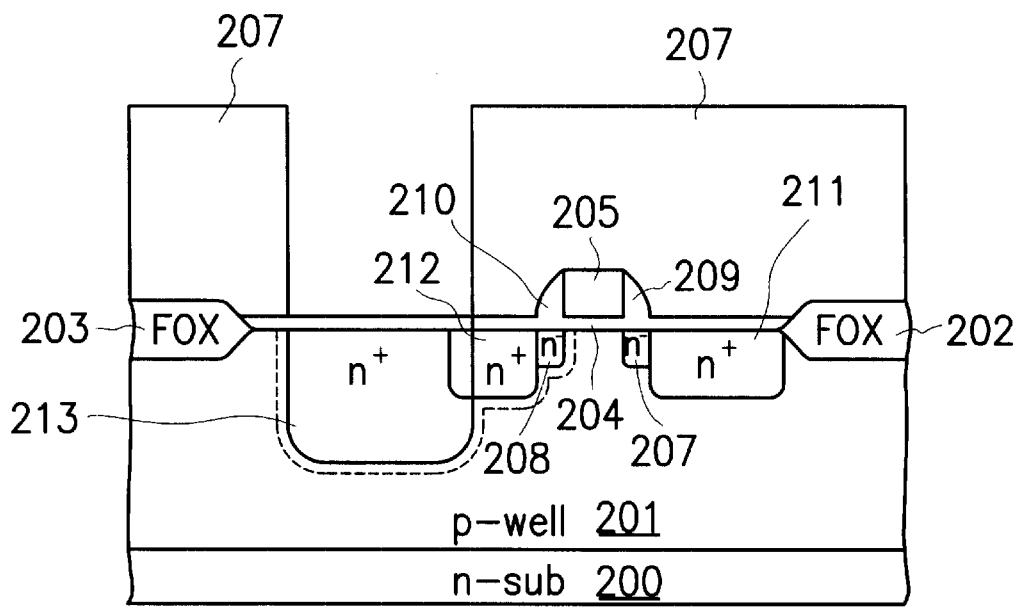
Figure 2C:
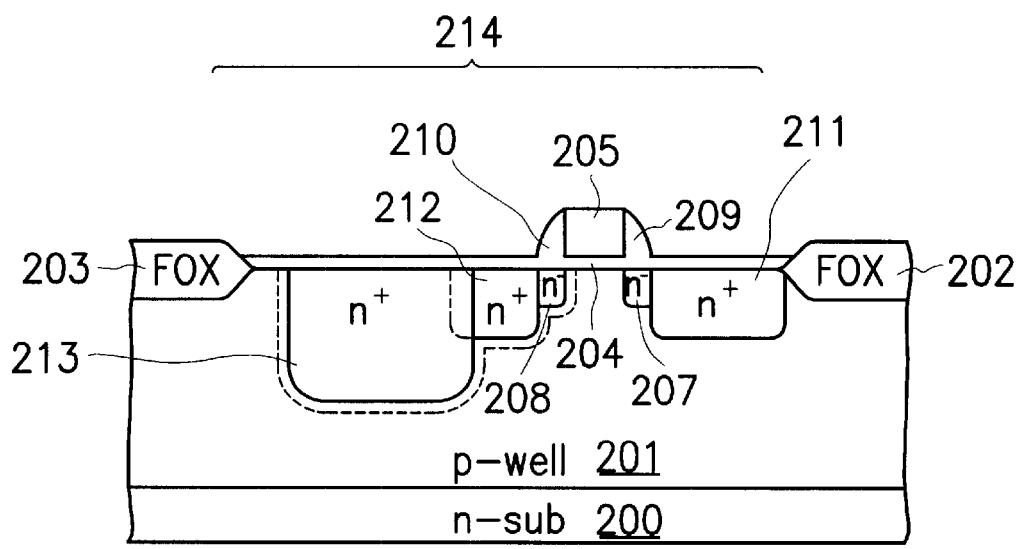

FIGS. 2A through 2C present a first preferred embodiment of the invention. FIGS. 2A through 2C are cross-sectional views of a portion of a semiconductor device showing a complementary metal oxide semiconductor sensor according to a first preferred embodiment of the invention.

In FIG. 2A, a substrate 200 having a P-type well 201, a first isolation 202, and a second isolation 203 thereon is provided. The first isolation 202 and the second isolation 203, such as a field oxide layer (FOX) and a shallow trench isolation (STI), are used to define an active region. A gate oxide layer 204 and a gate conductive layer 205 are sequentially formed on the P-type well 201. The gate conductive layer 205 is patterned. A mask layer 206 is formed on the P-type well 201 to cover the second isolation 203 and a portion of the P-well 201 adjacent to the second isolation 203. As a consequence, in this embodiment, the whole surface region of the P-well 101 between the gate conductive layer 205 and the first isolation 202 is substantially exposed, while only a portion of the surface region of the P-well 101 between the second isolation 203 is exposed. Using the mask layer 206, the gate conductive layer as a mask, a lightly n-type ion doping is performed to form first lightly doped drain region 207 and the second lightly doped drain region 208 in the P-well 201. A first spacer 209 and the second spacer 210 are formed on the side walls of the gate conductive layer 205 to cover the first and the second lightly doped drain regions 209 and 210, respectively. Using the mask 206, the gate conductive layer 205 and the first and second spacers 209 and 210 as mask, a heavily doping step is performed to form a first source/drain region 211 and a second source/drain region 212. As shown in FIG. 2A, the first source/drain region 207 is formed between the first lightly doped drain region 207 and the first isolation 202 in the P-well 201. The second source/drain region 212 is formed between the second lightly doped drain region 208 and the first mask layer 206 in the P-well 201.

Preferably, as shown in FIG. 2A, the first and second source/drain regions 211 and 212 are formed asymmetrical. In this embodiment, the second source/drain region 211 is smaller than the first source/drain region 212 in width. Furthermore, as shown in FIG. 2A, preferably, the first and second lightly doped drain regions 207 and 208 are shallower than the first and the second source/drain regions 211 and 212. However, it is appreciated that the depth of these regions may be altered for different specifications of devices, for example, the first and second lightly doped drain regions 207 and 208 may also be deeper than the first and the second source/drain regions 211 and 212 under some circumstances.

In FIG. 2B, the mask layer 206 is removed. Another mask layer 207 is formed on the P well 201. A portion of the gate oxide layer 204 covering the portion of the P-well 201 adjacent to the second isolation 203 is exposed. That is, the mask 207 covers the first and second isolations 202 and 203, the first and second source/drain regions 211 and 213, the gate conductive layer 205 and the first and second spacers 209 and 211. A heavily doping step is performed to form a sensor implantation region 213 adjacent to the second source/drain region 212. Since the P-well 201 adjacent to the second isolation 203 is covered by the mask 207, therefore, the sensor implantation region 213 is not adjacent to the second isolation 203. As a result, a depletion region induced at the junction between the sensor implantation region 213 and the P-well 201 is distant away from the second isolation 203. In other words, the sensor region is distant away from the second isolation 203. The possibility of leakage current occurring at the edge of the isolation region in the conventional structure is minimized, and thus, the capability for the pixels of a screen to keep charges is enhanced. After forming the sensor implantation region 213, the mask 207 is removed as shown in FIG. 2C.

Figure 2D:
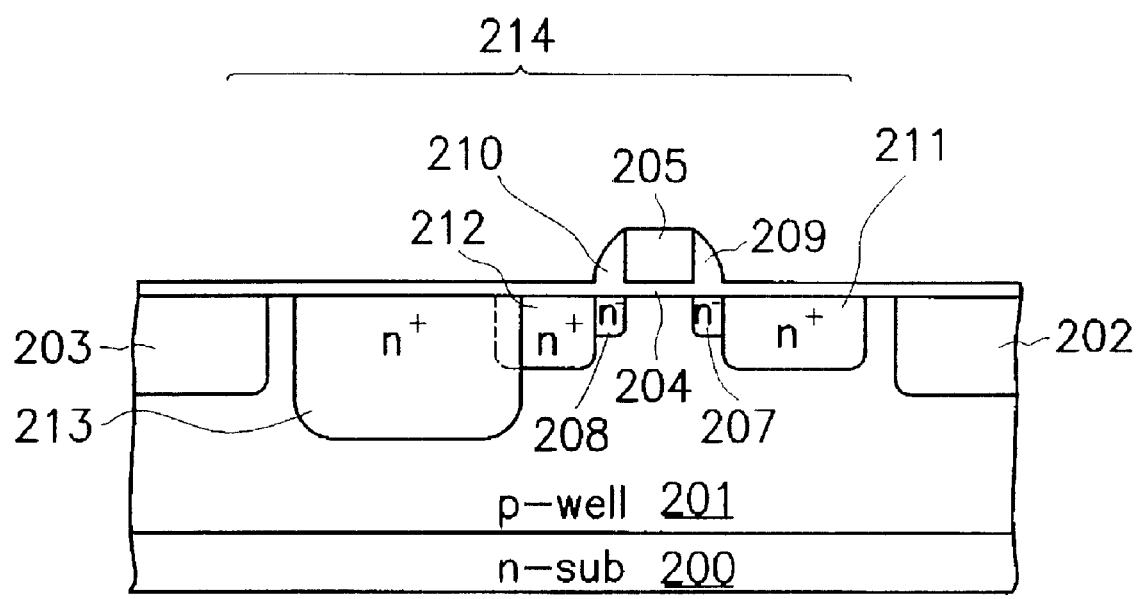
FIG. 2D is a cross-sectional view of a portion of a semiconductor device showing a complementary metal oxide semiconductor sensor according to another preferred embodiment of the invention.

Alternatively, FIG. 2D shows one possible equivalent structure comparable to the structure of FIG. 2C, by using shallow trench isolations as the first and second isolations.

In this embodiment, as shown in FIGS. 2B and 2C, the sensor implantation region 213 is formed with a depth deeper than the first and the second source/drain regions 211 and 212. It is appreciated that the depth of the sensor implantation region 213 may also be formed shallower than the first and the second drain regions 211 and 212 for different specifications. In addition, as shown in FIG. 2B, the mask 207 also exposes a side portion of the second source/drain region 212, so that the sensor implantation region 213 may also be formed to overlap with the second source/drain region 212. Therefore, a CMOS sensor is formed in an active region 214 defined by the first isolation 202 and the second isolation 204. Thus constructed, a depletion region at the junction between the sensor implantation region 213 and the P-well is encompassed by the solid line outlining the sensor implantation region 213 and the dash line drawn in FIG. 2B and 2C.

With regard to the doping concentration, obviously, the lightly doped drain regions 207 and 208 are lighter than the first and the second source/drain regions 211. According to specific requirement, the sensor implantation region 213 may be doped with a concentration similar to that of the first and the second source/drain regions 211 and 212. Or for certain specifications, the sensor implantation region 213 can also be doped with a concentration heavier or lighter than that of the first and the second source/drain regions 211 and 212.

An N-type sensor implantation region is formed in an NMOS in this embodiment. Though it might be a rare case, a P-type sensor implantation region can also be formed in a PMOS in an N-well using the identical method mentioned above simply by interchanging the conductivity N-type into P-type and P-type into N-type.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A metal-oxide semiconductor sensor, comprising:
 a first conductive type substrate;
 a second conductive type well located on the substrate;
 a first isolation and a second isolation located on the second conductive type well, wherein the first isolation and the second isolation define an active region;
 a gate having a gate layer and a gate oxide layer located within the active region on the second conductive type well, the gate layer being located on the gate oxide layer;
 a first spacer and a second spacer located on a first side wall and a second side wall of the gate;
 a first lightly doped drain region and a second lightly doped drain region under the first spacer and the second spacer in the second conductive type well, respectively, the first and second lightly doped drain regions being the first conductive type;
 a first source/drain region located in the second conductive type well between the first lightly doped drain region and the first isolation;
 a second source/drain region located between the second lightly doped drain region and the second isolation in the second conductive type well without adjacent to the second isolation, the first and the second source/drain regions being the first conductive type;
 a sensor implantation region located between the second source/drain region and the second isolation in the second conductive type well, the sensor implantation region being the first conductive type, wherein a depletion layer at a junction between the sensor implantation region and the second conductive type well is not in contact with the second isolation.

2. The sensor of claim 1, wherein the first isolation and the second isolation include a field oxide layer.

3. The sensor of claim 1, wherein the first isolation and the second isolation include a shallow trench isolation.

4. The sensor of claim 1, wherein the first conductive type includes N-type and the second conductive type includes P-type.

5. The sensor of claim 1, wherein the first conductive type includes P-type and the second conductive type includes N-type.

6. The sensor of claim 1, wherein the second source/drain region is overlapped with the sensor implantation region.

7. The sensor of claim 1, wherein the second source/drain region is narrower than the first source/drain region in width.

8. The sensor of claim 1, wherein the sensor implantation region has a deeper profile than a profile of the first and the second source/drain regions.

9. The metal-oxide semiconductor sensor of claim 1, wherein the depletion layer and the second isolation are separated by the second conductive type well by a distance sufficient to minimize leakage current at an edge of the second isolation.

10. A CMOS sensor, comprising:
 a N-type substrate;
 a PMOS on the N-type substrate;
 a P-well in the n-type substrate defined by at least an isolation;
 an NMOS located on the P-well; and
 an N-type sensor implantation region in the P-well, between a source/drain region of the NMOS and the isolation without being adjacent to the isolation, wherein a depletion layer at a junction between the N-type sensor implantation region and the P-well is not in contact with the isolation.

11. The CMOS sensor of claim 10, wherein the source/drain region is overlapped with the N-type sensor implantation region.

12. The CMOS sensor of claim 10, wherein the sensor implantation region has a deeper profile than a profile of the source/drain region.

* * * * *